(12) United States Patent
Dagan

(10) Patent No.: US 12,131,777 B2
(45) Date of Patent: Oct. 29, 2024

(54) RESISTIVE RANDOM-ACCESS MEMORY (RERAM) CELL OPTIMIZED FOR RESET AND SET CURRENTS

(71) Applicant: Weebit Nano Ltd., Hod Hasharon (IL)

(72) Inventor: Lior Dagan, Ram-On (IL)

(73) Assignee: Weebit Nano Ltd., Hod Hasharon (IL)

( * ) Notice: Subject to any disclaimer, the term of this patent is extended or adjusted under 35 U.S.C. 154(b) by 200 days.

(21) Appl. No.: 17/937,186

(22) Filed: Sep. 30, 2022

(65) Prior Publication Data

US 2023/0096127 A1     Mar. 30, 2023

Related U.S. Application Data

(60) Provisional application No. 63/250,539, filed on Sep. 30, 2021.

(51) Int. Cl.
   *G11C 13/00*     (2006.01)

(52) U.S. Cl.
   CPC ...... *G11C 13/0028* (2013.01); *G11C 13/0026* (2013.01); *G11C 13/0064* (2013.01); *G11C 13/0097* (2013.01)

(58) Field of Classification Search
   CPC ............ G11C 13/0028; G11C 13/0026; G11C 13/0064; G11C 13/0097; G11C 13/0069; G11C 13/0004; G11C 2213/79
   USPC .................................................. 365/148, 158
   See application file for complete search history.

(56) References Cited

U.S. PATENT DOCUMENTS

| 7,924,601 B2 | 4/2011 | Aoki |
| 8,587,986 B2 | 11/2013 | Kitagawa et al. |
| 8,767,439 B2 | 7/2014 | Terai |
| 8,995,169 B1 | 3/2015 | Bandyopadhyay et al. |
| 9,082,964 B2 | 7/2015 | Hong et al. |
| 9,183,914 B2 | 11/2015 | Owada |
| 9,312,002 B2 | 4/2016 | Navon et al. |
| 9,368,207 B2 | 6/2016 | Bandyopadhyay et al. |
| 9,472,280 B2 | 10/2016 | Siau et al. |

(Continued)

OTHER PUBLICATIONS

Arita, M. et al., "Switching Operation and Degradation of Resistive Random Access Memory Composed of Tungsten Oxide and Copper Investigated Using In-Situ TEM", Scientific Reports, 5, 17103, DOI: 10.1038/srep17103.

(Continued)

*Primary Examiner* — Michael T Tran
(74) *Attorney, Agent, or Firm* — M&B IP Analysts, LLC

(57) ABSTRACT

A resistive random-access memory (ReRAM) cell includes a field-effect transistor (FET) and a resistive element. The FET having a gate port, a drain port, and a source port. The gate port is connected to a word-line (WL) of the ReRAM cell, the source port is connected to a bit-line (BL) of the ReRAM cell, and a first port of the resistive element is connected to the drain of the FET. A second port of the resistive element is connected to a source-line (SL) of the ReRAM cell. During reset operation SL is connected to a high-voltage and BL to a low-voltage. During set operation SL is connected to a low-voltage and BL to a high-voltage. Using this common source configuration overcomes the requirement for a wider FET width of the prior art so as to accommodate the current supply needed during reset operation, and avoids overstressing of the FET.

30 Claims, 10 Drawing Sheets

(56) References Cited

U.S. PATENT DOCUMENTS

| | | |
|---|---|---|
| 9,478,287 B2 | 10/2016 | Chou et al. |
| 9,711,216 B2 | 7/2017 | Hase et al. |
| 10,522,224 B2 | 12/2019 | McCollum |
| 10,650,890 B2 | 5/2020 | McCollum |
| 10,878,905 B1 | 12/2020 | McCollum et al. |
| 2009/0168495 A1* | 7/2009 | Aoki .................. G11C 13/0064 365/189.16 |
| 2010/0182820 A1* | 7/2010 | Kitagawa ................ G11C 11/56 365/189.011 |
| 2012/0020141 A1* | 1/2012 | Kitagawa ........... G11C 13/0007 365/148 |
| 2012/0087172 A1* | 4/2012 | Aoki .................. G11C 11/1673 365/148 |
| 2014/0112055 A1* | 4/2014 | Kawahara .............. G11C 13/00 365/148 |
| 2015/0279457 A1* | 10/2015 | Mochida ............. G11C 11/2255 257/5 |
| 2017/0345496 A1* | 11/2017 | Liu .................... G11C 13/0026 |
| 2021/0005251 A1* | 1/2021 | Wang ...................... H10B 63/30 |
| 2021/0098611 A1* | 4/2021 | Hersam .................. G06N 3/065 |
| 2021/0167128 A1* | 6/2021 | Ando .................... H10B 63/845 |
| 2021/0247962 A1* | 8/2021 | Chang .................... G06N 3/063 |
| 2022/0020431 A1* | 1/2022 | Dagan ................ G11C 13/0028 |
| 2022/0262420 A1* | 8/2022 | Yokoyama .......... G11C 11/1673 |
| 2022/0284955 A1* | 9/2022 | Dagan ................ G11C 13/0026 |
| 2022/0406781 A1* | 12/2022 | Sakui .................... G11C 11/406 |
| 2023/0136097 A1* | 5/2023 | Tian ...................... H10N 70/841 257/2 |

OTHER PUBLICATIONS

Ielmini, D., Resisitive Switching Memories Based on Metal Oxides: Mechanisms, Reliability and Scaling, Semiconductor Science and Technology, 31 (2016) 063002 (25pp).

Levisse, A. et al., "Write Termination Circuits for RRAM: A Holistic Approach from Technology to Application Considerations", in IEEE Access, vol. 8, pp. 109297-109308, 2020, doi: 10.1109/ACCESS.2020.3000867.

Shih, Y-C. et al., "Smart Design of Resisitive Switching Memory by an In-Situ Current-Induced Oxidization Process on a Single Crystalline Metallic Nanowire", Adv. Electron. Mater., DOI: 10.1002/aelm.202000252.

* cited by examiner

| | Circuit 200 | | |
|---|---|---|---|
| | BL 230 | SL 240 | R 210 |
| Set | 0V | 2.4V | H→L |
| Reset | 2.4V | 0V | L→H |

| | Circuit 300 | | |
|---|---|---|---|
| | BL 330 | SL 340 | R 310 |
| Set | 2.4V | 0V | H→L |
| Reset | 0V | 2.4V | L→H |

RESISTIVE RANDOM-ACCESS MEMORY (RERAM) CELL OPTIMIZED FOR RESET AND SET CURRENTS

CROSS-REFERENCE TO RELATED APPLICATIONS

This application claims the benefit of U.S. Provisional Application No. 63/250,539 filed on Sep. 30, 2021, the contents of which are hereby incorporated by reference.

TECHNICAL FIELD

The present disclosure generally relates to resistive random-access memory (ReRAM) cells, and more particularly to the drive of a particular configuration of an optimized ReRAM cell for reset operation and set operation.

BACKGROUND

In typical resistive random-access memory (ReRAM) devices, the conventional ReRAM cell circuit 100 is configured as shown in FIG. 1A. A first port of a resistive element (R) 110 is connected to a bit-lit (BL) 130 and a second port of the resistive element 110 is connected to a drain port of an n-type field-effect transistor (NFET) 120. A gate of the NFET 120 is connected to the word-line (150) while the source port of the NFET 120 is connected to the source-line (SL) 140. FIG. 1B shows the set and reset voltages required for the operation of the circuit 100 at BL 130 and SL 140, as well as the resistive transition of the resistive element 110, from high-to-low resistance during set operation and from low-to-high resistance during reset operation. Note that when first programmed, the set operation is also referred to as "forming" of the ReRAM cell. Such configuration suffers from a deficiency due to current bottleneck of the NFET 120 to drive a high current in reset operation of the resistive element 110. It has been well-identified that an NFET driving a high voltage has a low overdrive, and body effect, which grows worse with lower gate voltage.

An example of a cross-section 100C of a conventional ReRAM cell 100 is shown in FIG. 1C. For simplicity and without limitation, FIG. 1C will also be discussed with reference to elements shown in FIG. 1A. As noted, it is common to use an NMOS transistor as the select transistor 120. The transistor comprises of a gate 121, an N+ Source 122, and an N+ drain 123. The source 122 and drain 123 are within a P well 162 which is manufactured above a P-Silicon substrate 161. The source 122 is connected using a metal via plug (referred to herein onward also as via or via plug) to a first metal layer 163, also referred to as M1, which is the source line 140. The gate 121 of the select transistor 120 is connected using a first via to the M1 layer 163 and then through a second via plug to a second metal layer 164, also referred to as M2, which is the word line 150. The drain 123 is connected using a via to an M1 conductor which is then connected using another via to a ReRAM resistor 110 that comprises of a stack of three layers, a bottom electrode 111 (BE), a resistor body layer 112, and a top electrode (TE) 113. The TE 113 is connected using a via to a M2 conductor and then through another via to a third metal layer 165, also referred to as M3, which is the bit line 130. In an embodiment the process of creating the ReRAM resistor 110 comprises patterning the stack into "dots". It should be noted that the BE 111 is inert while the TE 113 is a reactive electrode. It should be further noted that, in such embodiment, the reset operation, which requires higher current switching, passes current from the BE 111 to the TE 113. This requires the select transistor 120 to act as a high-side switch which is not optimal for an NFET transistor.

In another conventional example, shown in FIG. 2A, the resistive element 210 is connected such that its first port is connected to the source of the NFET 220 and its second port to the SL 240. The drain of the NFET 220 is connected to the BL 230 and the gate to the word-line 250. FIG. 2B shows the set and reset voltages required for the operation of the circuit 200 at BL 230 and SL 240 and the resistive transition of the resistive element 210, from high-to-low resistance during set operation and from low-to-high resistance during reset operation. It should be noted that, in order to operate as in circuit 100, the voltages in the set operation and reset operation shown in FIG. 2B are opposite to those shown in FIG. 1B. The example shown in FIG. 2A is no different than that of FIG. 1A, the path transistor 220 carries out a drain output operation when a voltage is applied to the resistive element 210 to execute a set operation. It drives the path transistor 220 to carry out a source follower operation when a voltage is applied to the memory element 200 to execute a reset operation. That is, in reset operation, the supply connection to SL 240 is to a high voltage, while in the set operation, the supply connection to SL 240 is to a low voltage.

Therefore, it has been identified that conventional ReRAM cell circuits suffer from the deficiency of operation of an NFET. That is, when an NFET diffusion is connected to a high voltage, it conducts less current than when connected to a low voltage. As a result, the NFETs (e.g., 120, FIG. 1A, 220, FIG. 2A, or the like) have to be designed to be larger transistors in order to enable sufficient current for the necessary operation of the ReRAM cells, be it 100 or 200, both operating in essentially the same mode of operation.

It would therefore be advantageous to provide a solution that overcomes the limitations noted above to reduce the size of the NFETs of ReRAM cells that is directly related to the overall size of the ReRAM cell.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a resistive random-access memory (ReRAM) cell. The ReRAM cell comprises: a bit-line (BL); a word-line (WL); a source-line (SL); a resistive element having a first port and a second port; and a field-effect transistor (FET) having a gate port, a drain port, and a source port; wherein the BL is connected to the source port; wherein the WL is connected to the gate port; wherein the drain port is connected to the first port of the resistive element; wherein the SL is connected to the second port of the resistive element; and wherein the ReRAM cell is adapted to operate in a common source configuration during a reset operation of the resistive element and in a source follower configuration during a set operation of the resistive element.

Certain embodiments disclosed herein include a resistive random-access memory (ReRAM). The ReRAM comprises: a ReRAM array, the ReRAM array comprises a plurality of ReRAM cells arranged in rows and columns within the ReRAM array, each ReRAM cell comprises: a bit-line (BL); a word-line (WL); a source-line (SL); a resistive element having a first port and a second port; and a field-effect transistor (FET) having a gate port, a drain port, and a source port; wherein the BL is connected to the source port; wherein the WL is connected to the gate port; wherein the drain port is connected to the first port of the resistive element; wherein the SL is connected to the second port of the resistive element; wherein each row of the ReRAM array has a word-line input connected to the WL of each of the ReRAM cells of a respective row; wherein each column of the ReRAM has a bit-line input connected to the BL of each of the ReRAM cells of a respective column; and, wherein each column of the ReRAM has a source-line input connected to the SL of each of the ReRAM cells of a respective column.

Certain embodiments disclosed herein include a method for programming a ReRAM cell. The method comprises: applying a lower voltage at a source-line of the ReRAM cell than a voltage at a bit-line of the ReRAM cell for a set operation of a resistive element, wherein the ReRAM cell is adapted to operate in a source follower configuration.

Certain embodiments disclosed herein include a method for programming a ReRAM cell. The method comprises: applying a lower voltage at a bit-line of the ReRAM cell than a voltage at a source-line of the ReRAM cell for a reset operation of a resistive element, wherein the ReRAM cell is adapted to operate in a common source configuration.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figures 1A, 1B:
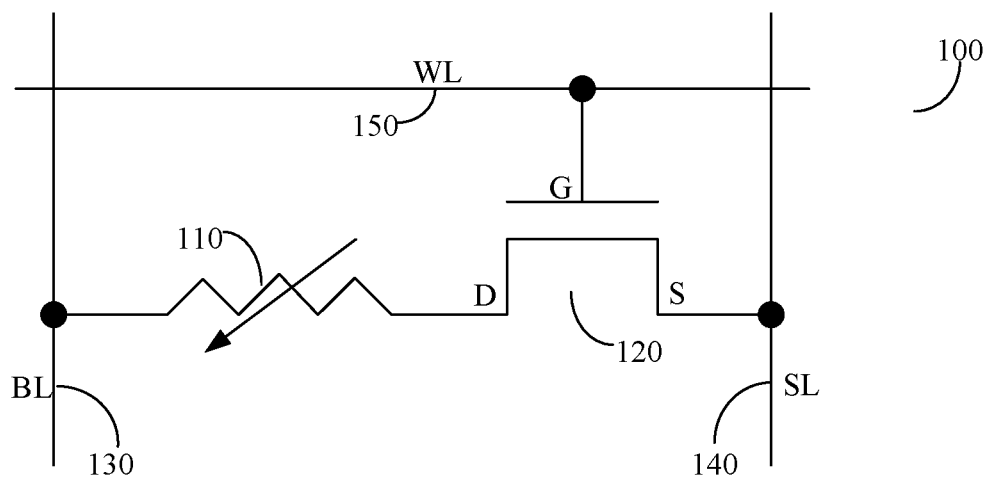
FIG. 1A is a schematic diagram of a first conventional ReRAM cell.
FIG. 1B is a table showing set and reset voltages of a first conventional ReRAM cell.

It is important to note that the embodiments disclosed herein are only examples of the many advantageous uses of the innovative teachings herein. In general, statements made in the specification of the present application do not necessarily limit any of the various claims. Moreover, some statements may apply to some inventive features but not to others. In general, unless otherwise indicated, singular elements may be in plural and vice versa with no loss of generality. In the drawings, like numerals refer to like parts through several views.

The term "NFET" refers to an n-channel, or n-type, field-effect transistor (FET). The term "PFET" refers to a p-channel, or p-type, FET. Specifically, when referring to transistors or FETs, these may include a variety of different implementations, such as, but not by way of limitation, planar FETs, fin field-effect transistors (FinFETs), metal-oxide semiconductor FETs (MOSFETs), and complementary MOSFETs (CMOSFETs). While specific voltages levels are described herein, for example 0V and 2.4V, these should not be viewed as limiting upon the disclosed embodiments, but as example voltages applied in a given technology node, for example, a 130 nm technology node. The discussion herein shall be described with respect to NFETs, however, this should not be viewed as limiting upon the disclosed embodiments and different types of FETs may be used without departing from the scope of the present disclosure.

Figures 3A, 3B:
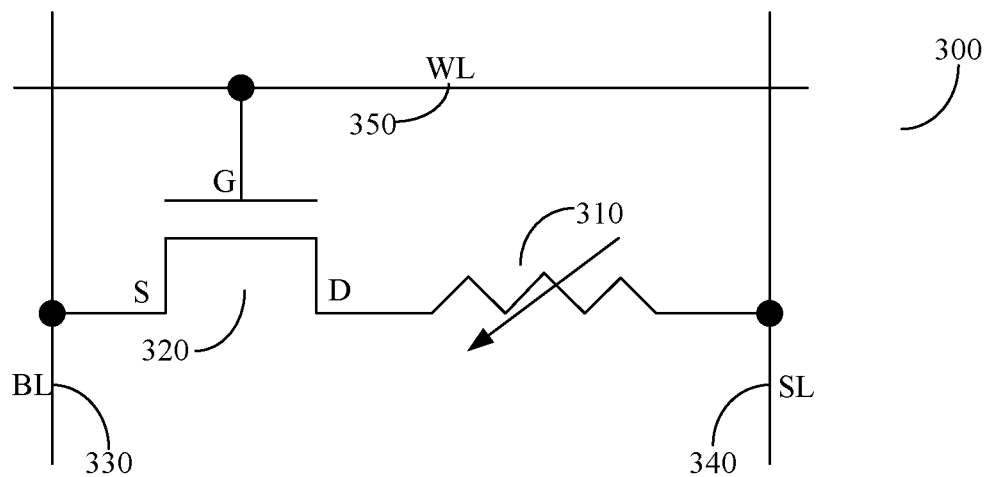
FIG. 3A is a ReRAM cell configured to operate according to an embodiment.
FIG. 3B is a table showing set and reset voltages of the ReRAM cell according to an embodiment.

FIG. 3A shows a schematic circuit diagram of a resistive random-access memory (ReRAM) cell 300 comprises a field-effect transistor (FET) 320 and a resistive element 310 according to an embodiment. The FET 320 has a gate port, a drain port, and a source port. The gate port is connected to a word-line (WL) 350 of the ReRAM cell 300, the source port is connected to a bit-line (BL) 330 of the ReRAM cell 300, and a first port of the resistive element 310 is connected to the drain of the FET 320. A second port of the resistive element 310 is connected to a source-line (SL) 340 of the ReRAM cell 300.

The operating voltage of the circuit 300 is shown in FIG. 3B. During reset operation, the SL 340 is connected to a high-voltage (e.g., 2.4V) and the BL 330 to a low-voltage (e.g., 0V). During set operation the SL 340 is connected to a low-voltage (e.g., 0V) and the BL 330 to a high-voltage (e.g., 2.4V). Using such common source configuration overcomes a need for a wider FET width so as to accommodate the current supply needed during reset operation, and avoids overstressing of the FET. It should be noted that, in such configuration, the BL, for example BL 330, receives the higher voltage at set, while the SL, for example SL 340, receives higher voltage at reset. The FETs, for example FET 320, may be formed on, for example but not limited to, a bulk-substrate wafer, a silicon on insulator (SOI) wafer, or the like.

It should be therefore understood that the operation of the circuit 300 is the reverse of that which is used in related arts, i.e., the FET 320 operates in a common source during reset operation. By contrast, during set operation, the FET 320 operates in source-follower mode.

Figures 2A, 2B:
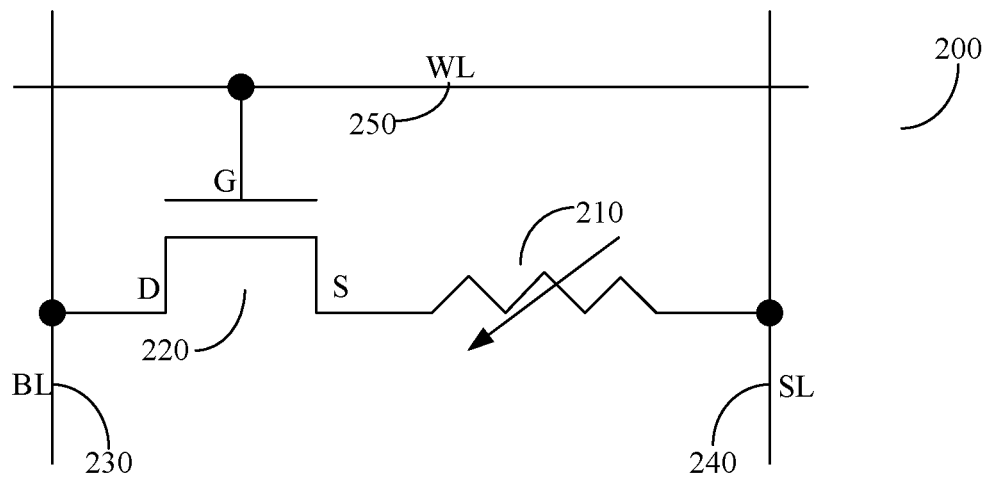
FIG. 2A is a schematic diagram of a second conventional ReRAM cell.
FIG. 2B is a table showing set and reset voltages of a second conventional ReRAM cell.

The operation is opposite to the operation of circuits in the related art, for example but is not limited to, 100 of FIG. 1A and 200 of FIG. 2A where the respective NFETs 120 and 220 operate in source-follower mode during reset operation, and in common source mode during set operation. Such operations in the related art are suboptimal due to the limitation of their respective NFETs (e.g., 120 and 220), to drive the higher current requirements when performing the reset operation. This is because a source follower circuit using NFET has far less current driving versus a common source circuit, using same transistor size and gate voltage. As a result, larger NFETs are required, which mean larger integrated circuits (ICs) resulting in higher costs as well as lower yields. This issue has to do with the fact that when driving a high voltage, the NFET has low overdrive and a body effect that grows worse with lower gate voltages. The modes of operation of circuit 300 as suggested in its respective table shown in FIG. 3B, make the NFET 320 more conductive during reset operation while self-limiting current during set operation. Hence, circuit 300 provides the room for optimization of the size of the NFET 320 to provide higher currents without requiring a larger transistor.

Figure 4:
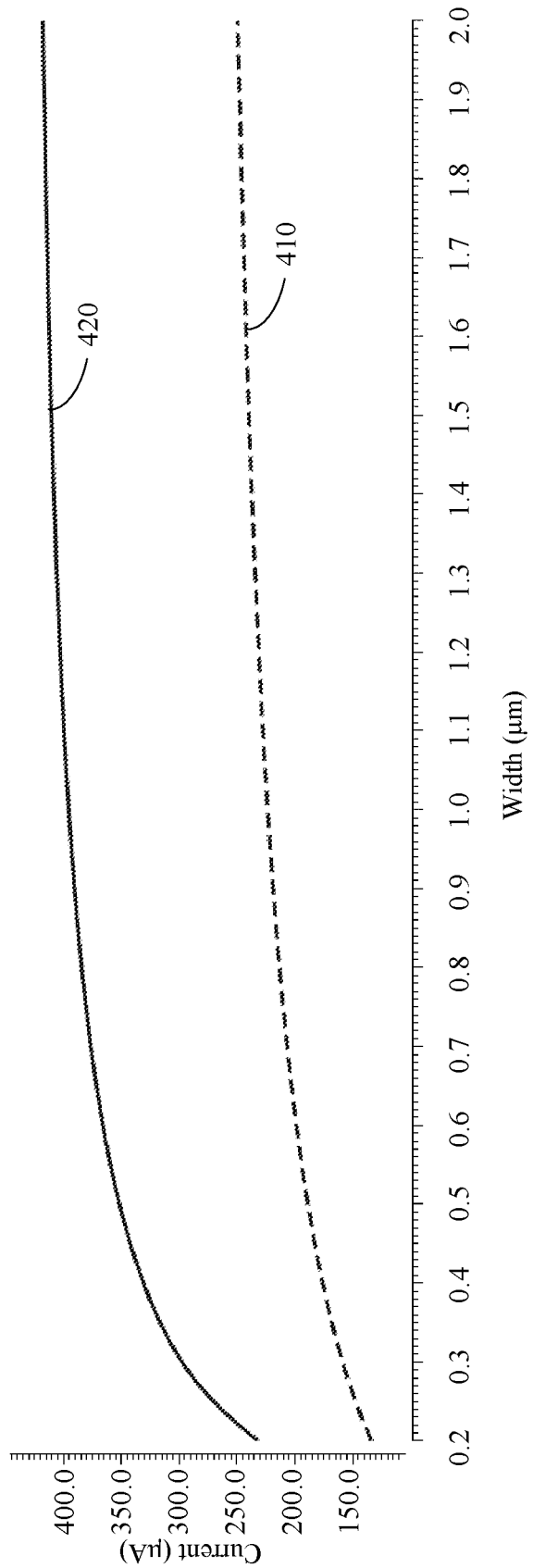
FIG. 4 is a graph showing ReRAM reset operation current consumption comparison of a conventional ReRAM cell and a ReRAM cell configured according to an embodiment.
Figure 5:
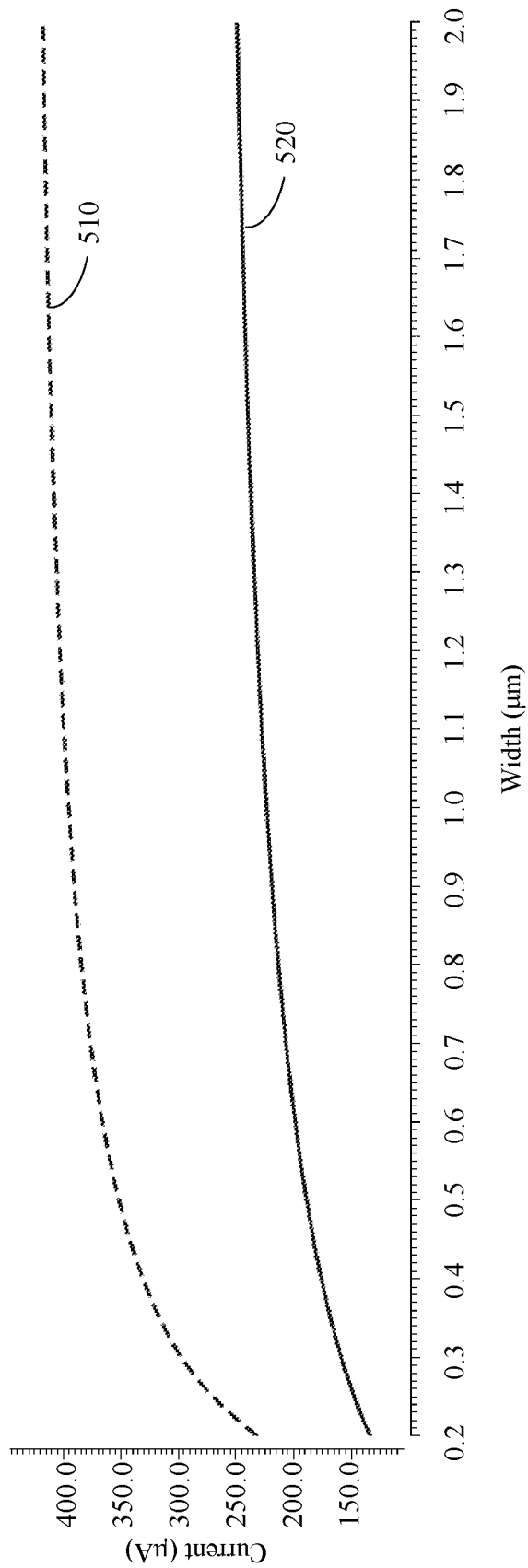
FIG. 5 is a graph showing ReRAM set operation current consumption comparison of a conventional ReRAM cell and a ReRAM cell configured according to an embodiment.

FIGS. 4 and 5 show example graphs that compare current consumption between a conventional ReRAM cell and a ReRAM according to an embodiment when in a reset operation (FIG. 4) and a set operation (FIG. 5). The ReRAM cells in both embodiments have FETs of the same width. In the specific example embodiments the following conditions are used: a) 2.2V BL and 0V SL for set, and 2.2V on SL and 0V on BL for reset; b) resistive element value is 5 KOhm (end of set, beginning of reset), and current must be maintained in DC; c) NFET is a 1.2V device, over-stressed, length of 130 nm gate voltage is 2.4V; and, d) select needs to hold 140 µA for set, 240 µA for reset current. The width is swept from 0.2 µm to 2 µm.

FIG. 4 shows driving power vs. width curve (dashed) 410 of a conventional transistor, for example transistor 220, and the driving power vs. width curve 420 of an embodiment, for example transistor 320, in reset mode. The figure demonstrates transistor gate widths of 0.3 µm and 1.5 µm to drive the current for the embodiment and the convention transistors, respectively.

FIG. 5 shows driving power vs. width curve (dashed) 510 of a conventional transistor, for example transistor 220, and the driving power vs. width curve 520 of an embodiment in set mode. The figure shows a transistor gate width of 0.25 µm for the embodiment, while a transistor gate width for the conventional transistor is 0.2 µm to drive the current. Such comparison indicates that larger gate widths are necessary in conventional transistors (e.g., 1.5 µm) than transistors according to the embodiment (e.g., 0.3 µm). To this end, it should be noted that ReRAM cell circuits according to the embodiment provides clear advantages of smaller transistor gate widths, and thus, overall size of the ReRAM cell.

Figure 6:
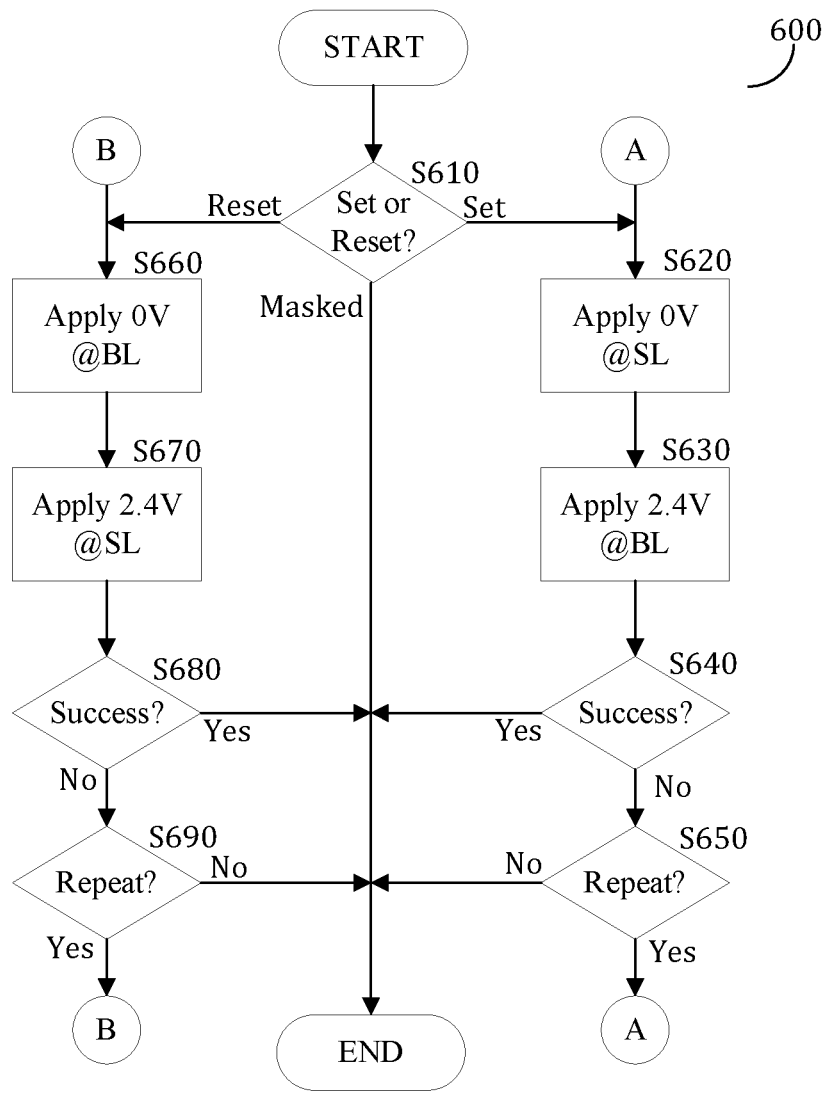
FIG. 6 is a flowchart for programming a ReRAM cell according to an embodiment.

FIG. 6 is an example flowchart 600 for programming of a ReRAM cell (e.g., the ReRAM cell 300, FIG. 3) according to an embodiment.

At S610, it is checked whether to perform set operation or reset operation for a particular bit and if determined to perform set operation then execution continues with S620; otherwise, execution continues with S660. In some embodiments, the ReRAM cell is masked, i.e., there is no need to either set or reset, and execution terminates.

In S620, a 0V is applied to SL, for example SL 340, FIG. 3. In S630, a 2.4V is applied to the BL, for example BL 330, FIG. 3. While not described herein, it is assumed that the WL, for example WL 350, FIG. 3, receives the necessary signal to enable the NFET transistor, for example NFET 320, FIG. 3. In S640, it is checked if the set operation was successful for the ReRAM cell being programmed and if so, execution terminates; otherwise, execution continues with S650. The check for success is performed using one of multiple common verification techniques. In S650 it is checked whether the set operation should be repeated for the ReRAM cell and if so, execution continues with S620; otherwise, execution terminates.

In S660, a 0V is applied to BL, for example BL 320, FIG. 3. In S670, a 2.4V is applied to the SL, for example SL 340, FIG. 3. While not described herein, it is assumed that the WL, for example WL 350, FIG. 3, receives the necessary signal to enable the NFET transistor, for example NFET 320, FIG. 3. In S680, it is checked if the reset operation was successful for the ReRAM cell being programmed and if so, execution terminates; otherwise, execution continues with S690. The check for success is performed using one of multiple verification techniques that typically include reading the programmed ReRAM cell. In S690, it is checked whether the reset operation should be repeated for the ReRAM cell and if so, execution continues with S660; otherwise, execution terminates.

Figure 1C:
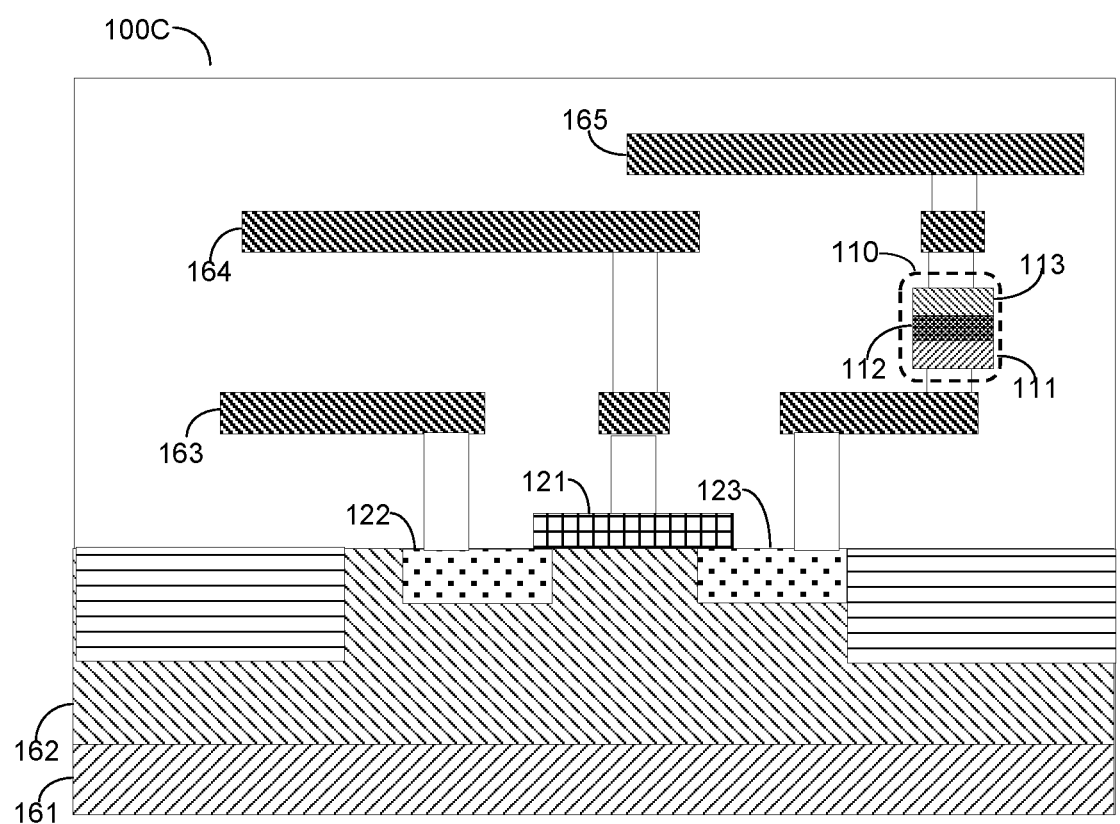
FIG. 1C is a cross-section of a first conventional ReRAM cell.

As noted above, relevant conventional circuits (e.g., 100, FIG. 1 and 200, FIG. 2) operate in the opposite manner than the disclosed art in circuit 300, FIG. 3. While in set operation the respective NFETs 120 and 220 operate in common source, the NFET 320 operates as a source follower. In reset operation, where a higher current is required when compared to the set operation, the prior art NFETS 120 and 220 operate as source followers, while the NFET 320 operates in common source. The advantage of the disclosed art is that more current can be provided when needed and therefore a small-sized NFET may be used. It should be appreciated that in the disclosed circuit 300 during reset operation the high voltage, e.g., 2.4V is provided directly to the resistive element 310 and the NFET 320 directly connected through its diffusion to the low voltage, e.g., 0V. The circuit 300 during set operation has the resistive element 310 connected to a low voltage, e.g., 0V, while the NFET 320 through its diffusion is connected to a high voltage, e.g., 2.4V. It should be further appreciated that circuits of the related art such as 100, FIG. 1 and 200, FIG. 2 have the oppositive connectivity and hence their NFET size deficiencies compared to the disclosed embodiments.

Figure 7:
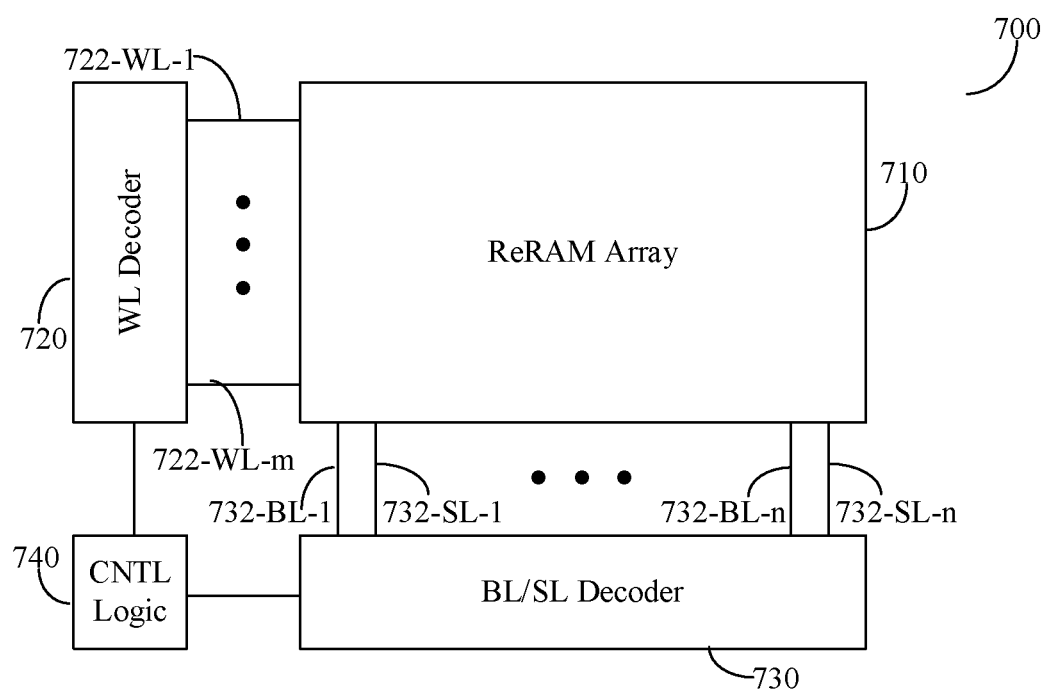
FIG. 7 is a ReRAM with a bit-line and source-line decoder adapted to set and reset resistive elements of each of the ReRAM cells of a ReRAM array according to an embodiment.

FIG. 7 is an example ReRAM 700 with a bit-line and source-line decoder 730 adapted to set and reset resistive elements of each of the ReRAM cells of a ReRAM array 710 according to an embodiment. The ReRAM cells of the ReRAM array 710 are each of the kind shown in FIG. 3A circuit 300, each having a respective WL port, e.g., WL 350, BL port, e.g., BL 330, and SL port, e.g., SL 340. The bit-lines BL and the source-lines SL of a column of ReRAM cells are connected to a BL/SL decoder 730, e.g., 732-BL-1 and 732-SL-1 respectively. Each column has its respective BL and SL connecting port of BL/SL decoder 730. This begins with 732-BL-1 and 732-SL-1 through 732-BL-n and 732-SL-n, where 'n' is an integer equal to or greater than '1'. The word-lines of each row of ReRAM cells within the ReRAM array 710 is connected to a respective word-line WL which is an output from a WL decoder 720, for example 722-WL-1. The WL decoder 720 provides connection ports to each row of ReRAM cells by connecting to 722-WL-1 through 722-WL-m, where 'm' is an integer equal to or greater than '1'. The WL decoder 720, under the control of control logic 740 provides the appropriate word-line, e.g., word-line 722-WL-1, which enables the ReRAM cells of this row to enter reset operation or set operation as the case maybe. The BL/SL decoder 730, under the control of the control logic 740, provides on each of the BL and SL lines, the necessary voltage as further described herein, and in particular with respect of FIGS. 3A and 3B. It should be appreciated that the ReRAM shown in FIG. 7 is but one way of exploiting the teachings herein and therefore does not limit the scope of the present disclosure.

Figure 8:
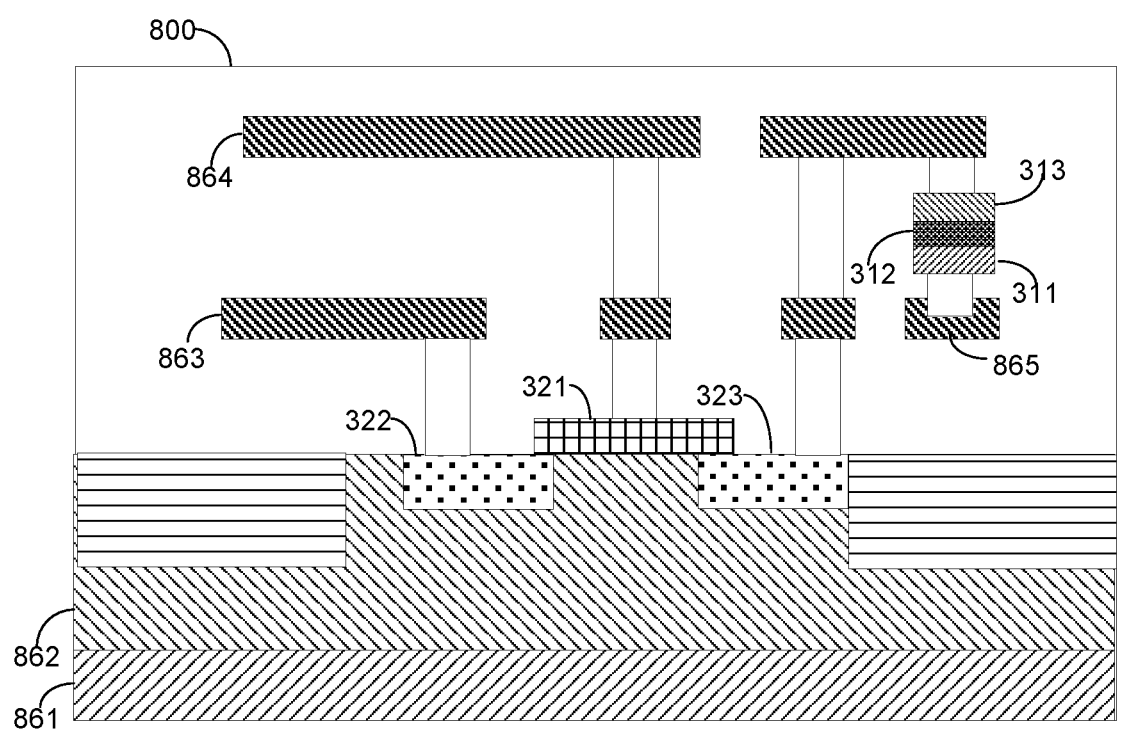
FIG. 8 is a cross-section of a ReRAM cell according to one embodiment.

An example cross-sectional schematic diagram 800 of a ReRAM cell 300 is shown in FIG. 8. As noted above, an NMOS transistor is selected as a transistor 320 for its superior drive capabilities. However, such example transistor should not be viewed as limiting upon the scope of the present disclosure. For simplicity and without limitation, FIG. 8 will also be discussed with reference to elements shown in FIG. 3A. The transistor 320 comprises of a gate 321, an N+ Source 322, and an N+ drain 323. The source 322 and drain 323 are formed within a P well 862 which is manufactured above a P-Silicon substrate 861. The source 322 is connected using a metal via plug (referred herein onward also as via or via plug) to a first metal layer 863, also referred to as M1, which is the bit line 330. The gate 321 of select transistor 320 is connected using a first via to the M1 layer 863 and then through a second via plug to a second metal layer 864, also referred to as M2, which is the word line 350. The drain 323 is connected using a via to a M1 conductor which is then connected using another via to a M2 conductor which is then connected via a plug to the TE 313 of the ReRAM resistor 310 that comprises of a stack of three layers, a bottom electrode (BE) 311, a resistor body layer 312, and a top electrode (TE) 313. Essentially this forms a "snorkel"-like connection from the drain 323 to the TE 313 of the resistor 310 of the ReRAM cell 300. The BE 311 is connected using a via to a M1 conductor, which is the source line 340. In an embodiment the process of creating the ReRAM resistor comprises patterning the stack into "dots". It should be noted that the BE 311 is inert while the TE 313 is a reactive electrode. It should be further appreciated that in this embodiment during the high-current reset operation, the transistor 320 is a low-side-switch, which is advantageous for an NMOS transistor and hence superior over related arts.

Figure 9:
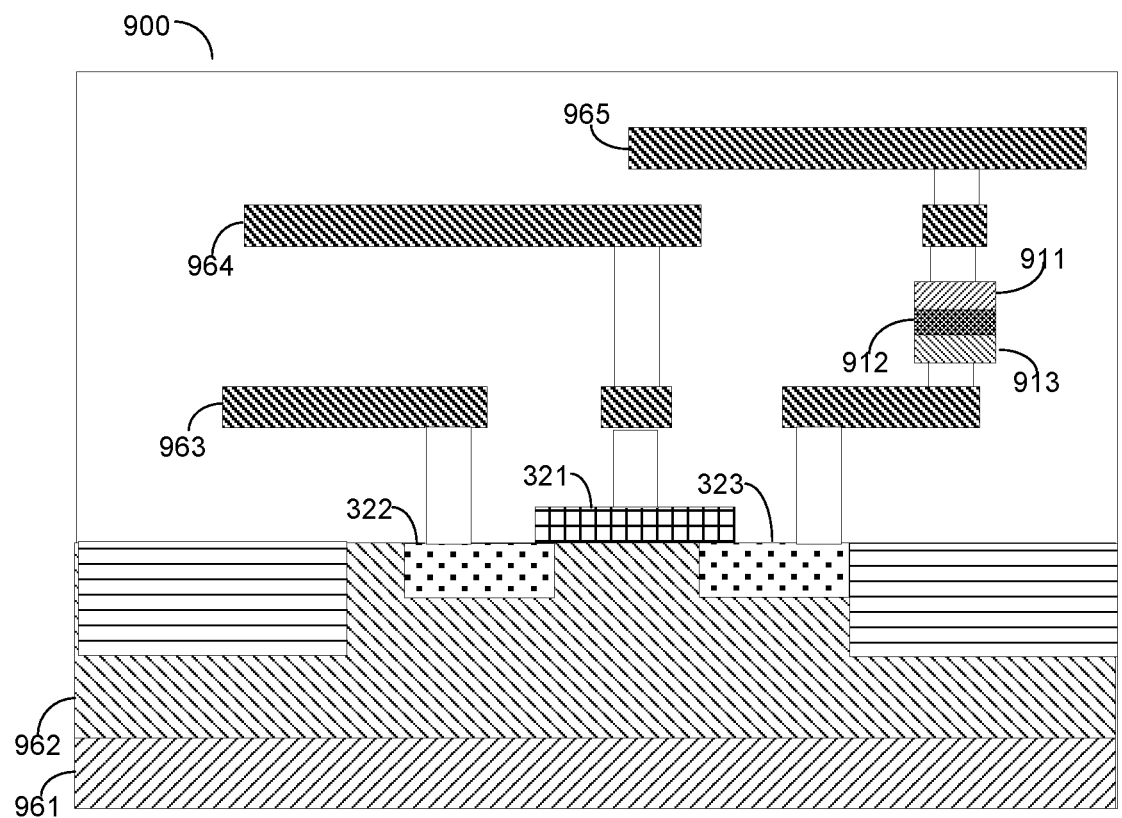
FIG. 9 is a cross-section of a ReRAM cell according to another embodiment.

Another example embodiment of ReRAM 300 is shown in FIG. 9 which depicts a cross-section 900. As noted, an NMOS transistor is the selected transistor 320 for its superior drive capabilities but should not be viewed as limiting upon the scope of the present disclosure. For simplicity and without limitation, FIG. 9 will also be discussed with reference to elements shown in FIG. 3A. The transistor 320 comprises of a gate 321, an N+ Source 322, and an N+ drain 323. The source 322 and drain 323 are formed within a P well 962 which is manufactured above a P-Silicon substrate 961. The source 322 is connected using a metal via plug to M1 963, which is the bit line 330. The gate 321 of select transistor 320 is connected using a first via to the M1 layer and then through a second via to a second metal layer 964, also referred to as M2, which is the word line 350. The drain 323 is connected using a via to a M1 conductor which is then connected using another via to a ReRAM resistor 310 that comprises of a stack of three layers. However, as opposed to the stack of FIG. 1C, here the stack comprises a reactive bottom electrode 913 (BE), a resistor body layer 912, and an inert top electrode (TE) 911. That is, the process sequence for the resistor stack 310 is changed so that the active electrode is now the bottom electrode. The TE 911 is connected using a via to a M2 conductor and then through another via to a third metal layer 965, also referred to as M3, which is the source line (SL) 340. In an embodiment the process of creating the ReRAM resistor comprises patterning the stack into "dots". It should be appreciated that, in this embodiment, the transistor 320 is a low-side-switch when operating in the reset mode, which is advantageous for an NMOS transistor and hence superior over the related art.

All examples and conditional language recited herein are intended for pedagogical purposes to aid the reader in understanding the principles of the disclosed embodiment and the concepts contributed by the inventor to furthering the art and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; 2A; 2B; 2C; 3A; A and B in combination; B and C in combination; A and C in combination; A, B, and C in combination; 2A and C in combination; A, 3B, and 2C in combination; and the like.

What is claimed is:

1. A resistive random-access memory (ReRAM) cell comprising:
    a bit-line (BL);
    a word-line (WL);
    a source-line (SL);
    a resistive element having a first port and a second port; and
    a field-effect transistor (FET) having a gate port, a drain port, and a source port;
    wherein the BL is connected to the source port;
    wherein the WL is connected to the gate port;
    wherein the drain port is connected to the first port of the resistive element;
    wherein the SL is connected to the second port of the resistive element; and
    wherein the ReRAM cell is adapted to operate in a common source configuration during a reset operation of the resistive element and in a source follower configuration during a set operation of the resistive element.

2. The ReRAM cell of claim 1, wherein the FET is any one of: an n-type FET (NFET) and a p-type FET (PFET).

3. The ReRAM cell of claim 1, wherein the FET is any one of: a planar FET, a FinFET, and a metal-oxide semiconductor FETs (MOSFET).

4. The ReRAM cell of claim 1, wherein, at the reset operation, an absolute voltage at the BL is a low voltage that is lower than an absolute voltage of the SL.

5. The ReRAM cell of claim 4, wherein the low voltage is 0 V.

6. The ReRAM cell of claim 1, wherein, at the set operation, an absolute voltage at the SL is a low voltage that is lower than an absolute voltage of the BL.

7. The ReRAM cell of claim 6, wherein the low voltage is 0 V.

8. The ReRAM cell of claim 1, wherein the first port of the resistive element is a reactive electrode of a resistor stack.

9. The ReRAM cell of claim 8, wherein the resistor stack comprises the reactive electrode, an inert electrode, and a resistor body layer deposed therebetween.

10. A resistive random-access memory (ReRAM) comprising:
a ReRAM array, the ReRAM array comprises a plurality of ReRAM cells arranged in rows and columns within the ReRAM array, each ReRAM cell comprises:
a bit-line (BL);
a word-line (WL);
a source-line (SL);
a resistive element having a first port and a second port; and
a field-effect transistor (FET) having a gate port, a drain port, and a source port;
a word-line decoder having a plurality of word-line outputs, wherein each word-line output is connected to a respective word-line input of the ReRAM array;
a bit-line and source-line (BL/SL) decoder having a plurality of bit-line outputs, wherein each bit-line output is connected to a respective bit-line input of the ReRAM array, and wherein the BL/SL decoder having a plurality of source-line outputs, wherein each source-line output is connected to a respective source-line input of the ReRAM array; and
a control logic communicatively connected to the word-line decoder and the BL/SL decoder and adapted to cause the ReRAM cell of the ReRAM array to operate in a common source configuration during reset operation of the resistive element and in a source follower configuration during set operation of the resistive element;
wherein the BL is connected to the source port; wherein the WL is connected to the gate port;
wherein the drain port is connected to the first port of the resistive element;
wherein the SL is connected to the second port of the resistive element;
wherein each row of the ReRAM array has a word-line input connected to the WL of each of the ReRAM cells of a respective row;
wherein each column of the ReRAM array has a bit-line input connected to the BL of each of the ReRAM cells of a respective column; and
wherein each column of the ReRAM array has a source-line input connected to the SL of each of the ReRAM cells of a respective column.

11. The ReRAM of claim 10, wherein the FET is any one of: an n-type FET (NFET) and a p-type FET (PFET).

12. The ReRAM of claim 10, wherein the FET is any one of: a planar FET, a FinFET, and a metal-oxide semiconductor FETs (MOSFET).

13. The ReRAM of claim 10, wherein during the reset operation, an absolute voltage at the BL is a low voltage that is lower than an absolute voltage of the SL.

14. The ReRAM of claim 13, wherein the low voltage is 0 V.

15. The ReRAM of claim 10, wherein during the set operation, an absolute voltage at the SL is a low voltage that is lower than an absolute voltage of the BL.

16. The ReRAM of claim 15, wherein the low voltage is 0 V.

17. The ReRAM of claim 10, wherein the first port of the resistive element is a reactive electrode of a resistor stack.

18. The ReRAM of claim 17, wherein the resistor stack comprises the reactive electrode, an inert electrode, and a resistor body layer deposed therebetween.

19. A method for programming a resistive random-access memory (ReRAM) cell, comprising:
applying a lower voltage at a source-line of the ReRAM cell than a voltage at a bit-line of the ReRAM cell for a set operation of a resistive element, wherein the ReRAM cell is adapted to operate in a source follower configuration.

20. The method of claim 19, further comprising:
determining whether the programming of the ReRAM cell was successful; and
repeating the programming of the ReRAM cell upon determination that the programming was not successful.

21. The method of claim 19, wherein the ReRAM cell comprises: a bit-line (BL); a word-line (WL); a source-line (SL); a resistive element having a first port and a second port; and a field-effect transistor (FET) having a gate port, a drain port, and a source port; wherein the BL is connected to the source port; wherein the WL is connected to the gate port; wherein the drain port is connected to the first port of the resistive element; and, wherein the SL is connected to the second port of the resistive element.

22. The method of claim 21, wherein the FET is any one of: an n-type FET (NFET) and a p-type FET (PFET).

23. The method of claim 21, wherein the first port of the resistive element is a reactive electrode of a resistor stack, wherein the resistor stack comprises the reactive electrode, an inert electrode, and a resistor body layer deposed therebetween.

24. The method of claim 19, wherein the lower voltage is 0 V.

25. A method for programming a ReRAM cell, comprising:
applying a lower voltage at a bit-line of the ReRAM cell than a voltage at a source-line of the ReRAM cell for a reset operation of a resistive element, wherein the ReRAM cell is adapted to operate in a common source configuration.

26. The method of claim 25, further comprising:
determining whether the programming of the ReRAM cell was successful; and
repeating the programming of the ReRAM cell upon determination that the programming was not successful.

27. The method of claim 25, wherein the ReRAM cell comprises: a bit-line (BL); a word-line (WL); a source-line (SL); a resistive element having a first port and a second port; and a field-effect transistor (FET) having a gate port, a drain port, and a source port; wherein the BL is connected to the source port; wherein the WL is connected to the gate port; wherein the drain port is connected to the first port of the resistive element; and, wherein the SL is connected to the second port of the resistive element.

28. The method of claim 27, wherein the FET is any one of: an n-type FET (NFET) and a p-type FET (PFET).

29. The method of claim 27, wherein the first port of the resistive element is a reactive electrode of a resistor stack, wherein the resistor stack comprises the reactive electrode, an inert electrode, and a resistor body layer deposed therebetween.

30. The method of claim 25, wherein the lower voltage is 0 V.

* * * * *